(12) United States Patent
Lajoie et al.

(10) Patent No.: US 11,121,073 B2
(45) Date of Patent: Sep. 14, 2021

(54) THROUGH PLATE INTERCONNECT FOR A VERTICAL MIM CAPACITOR

(71) Applicant: Intel Corporation, Santa Clara, CA (US)

(72) Inventors: Travis Lajoie, Forest Grove, OR (US); Abhishek Sharma, Hillsboro, OR (US); Juan Alzate-Vinasco, Tigard, OR (US); Chieh-Jen Ku, Hillsboro, OR (US); Shem Ogadhoh, Beaverton, OR (US); Allen Gardiner, Portland, OR (US); Blake Lin, Portland, OR (US); Yih Wang, Portland, OR (US); Pei-Hua Wang, Beaverton, OR (US); Jack T. Kavalieros, Portland, OR (US); Bernhard Sell, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 652 days.

(21) Appl. No.: 15/943,565

(22) Filed: Apr. 2, 2018

(65) Prior Publication Data

US 2019/0304897 A1      Oct. 3, 2019

(51) Int. Cl.
  *H01L 23/522*   (2006.01)
  *H01L 49/02*    (2006.01)
  *H01L 27/108*   (2006.01)
  *H01L 23/532*   (2006.01)

(52) U.S. Cl.
  CPC ...... *H01L 23/5223* (2013.01); *H01L 23/5329* (2013.01); *H01L 27/10855* (2013.01); *H01L 27/10894* (2013.01); *H01L 28/91* (2013.01)

(58) Field of Classification Search
  CPC ............. H01L 23/5223; H01L 23/5329; H01L 27/10855; H01L 27/10894; H01L 28/91
  See application file for complete search history.

(56) References Cited

U.S. PATENT DOCUMENTS

| 9,331,137 | B1 * | 5/2016 | Ratakonda | ........ H01L 27/10855 |
| 2004/0061177 | A1 * | 4/2004 | Merchant | ................ H01L 28/60 257/349 |
| 2009/0200638 | A1 * | 8/2009 | Smith | ............... H01L 21/76816 257/532 |
| 2019/0326296 | A1 * | 10/2019 | Wang | .................... H01L 23/528 |

* cited by examiner

*Primary Examiner* — Dale E Page
*Assistant Examiner* — Quovaunda Jefferson
(74) *Attorney, Agent, or Firm* — Schwabe, Williamson & Wyatt, P.C.

(57) ABSTRACT

An interconnect structure is disclosed. The interconnect structure includes a first metal interconnect in a bottom dielectric layer, a via that extends through a top dielectric layer, a metal plate, an intermediate dielectric layer, and an etch stop layer, and a metal in the via to extend through the top dielectric layer, the metal plate, the intermediate dielectric layer and the etch stop layer to the top surface of the first metal interconnect. The metal plate is coupled to an MIM capacitor that is parallel to the via. The second metal interconnect is on top of the metal in the via.

20 Claims, 6 Drawing Sheets

THROUGH PLATE INTERCONNECT FOR A VERTICAL MIM CAPACITOR

TECHNICAL FIELD

Embodiments of the disclosure through plate interconnects and, in particular, through plate interconnects for vertical metal-insulator-metal (MIM) capacitors.

BACKGROUND

Embedded memory cell circuitry that includes a capacitor require a special routing and landing protocol in order to connect the capacitor plate of the embedded capacitor to memory cell logic. In many cases, because the connection is not made at the level of the embedded capacitor, special and/or extra patterning steps are required.

In one approach, to connect a top plate electrode of a vertical MIM capacitor to memory cell logic, a via is touched down on the top plate to make the connection. This approach is of limited use where the top plate electrode of the vertical MIM capacitor is located in a place other than the top of a dielectric layer. Consequently, another approach is required where the top plate electrode of the vertical MIM capacitor is located in a place other than the top of a dielectric layer.

DESCRIPTION OF THE EMBODIMENTS

Figure 1:
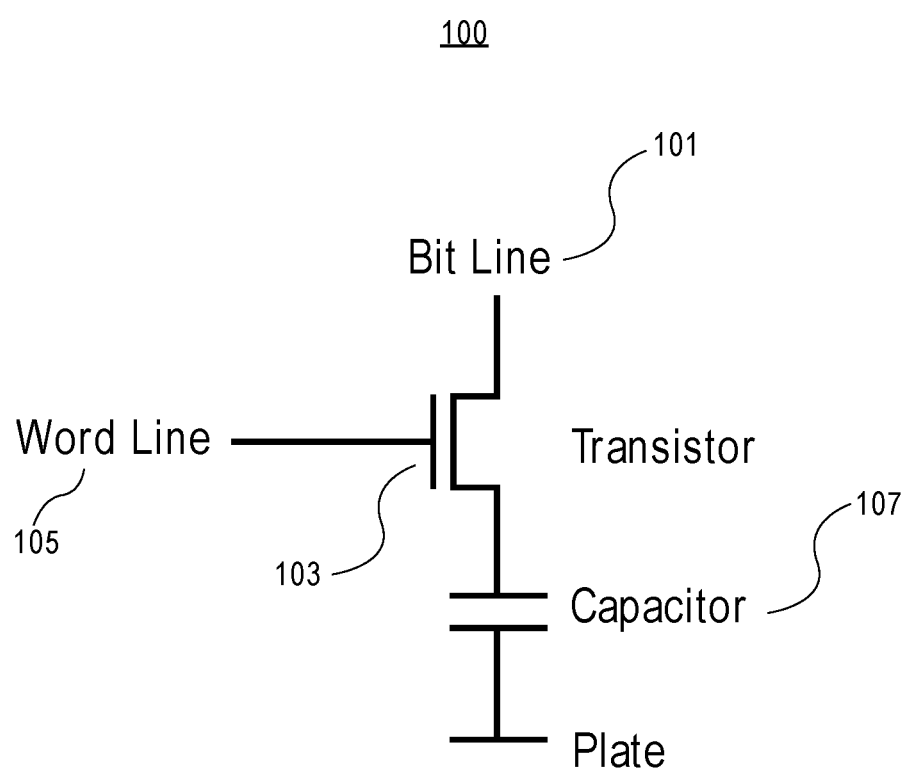
FIG. 1 is an illustration of a 1T (one transistor)-1C (one capacitor) DRAM memory cell.

Through plate interconnects for vertical metal-insulator-metal (MIM) capacitors are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

FIG. 1 is an illustration of a 1T-1C DRAM memory cell 100. Referring to FIG. 1, the DRAM memory cell 100 includes bitline 101, transistor 103, wordline 105 and capacitor 107. The DRAM memory cell 100 is made up of a single MOS transistor and a storage capacitor. The bitline 101 is coupled to the source of the transistor 103, the wordline 105 is coupled to the gate of the transistor 103 and the capacitor 107 is coupled to the drain of the transistor 103. In the fabrication of 1T-1C DRAM/eDRAM memory cells such as that shown in FIG. 1, the capacitor 107 can be formed above the bitline 101 in a configuration that is termed capacitor over bitline (COB). It should be appreciated that the placement of the capacitor in the physical structure of the memory cell is important to the achievement of dense DRAM designs and has significant memory cell capacitance and wiring consequences.

High density DRAM designs require densely ordered circuit components in order to minimize DRAM cell area. The minimization of DRAM cell area enables the production of DRAM devices that can provide greater storage capacity per unit area or similar storage capacity in a smaller area as compared to previous designs. In seeking denser DRAM devices a challenge that is encountered is to provide DRAM cell capacitors that have the sufficient storage capacitance.

Some conventional approaches to forming the DRAM capacitor cannot provide a capacitor aspect ratio that can provide the necessary storage capacitance in very small sized memory cells. Some conventional approaches form the capacitor either above or below the silicon substrate in order to provide a more vertically oriented and dense DRAM device. For example, the capacitor over bitline (COB) configuration has been used to achieve a capacitor aspect ratio to provide sufficient capacitance. In particular, COB enables capacitor size to be increased by increasing its size in the vertical direction.

However, a consequence of the COB configuration is that it can complicate the routing schemes to connect the storage capacitor to the memory cell logic. For example, because in COB configurations the memory cell logic to which the capacitor is connected can be located below the capacitor, the routing that couples the capacitor to the logic circuit can involve circuitous routing paths. Approaches for coupling a vertical MIM storage capacitor to an interconnect structure for purposes of connecting to memory cell logic are described with reference to FIGS. 2 and 3.

Figure 2:
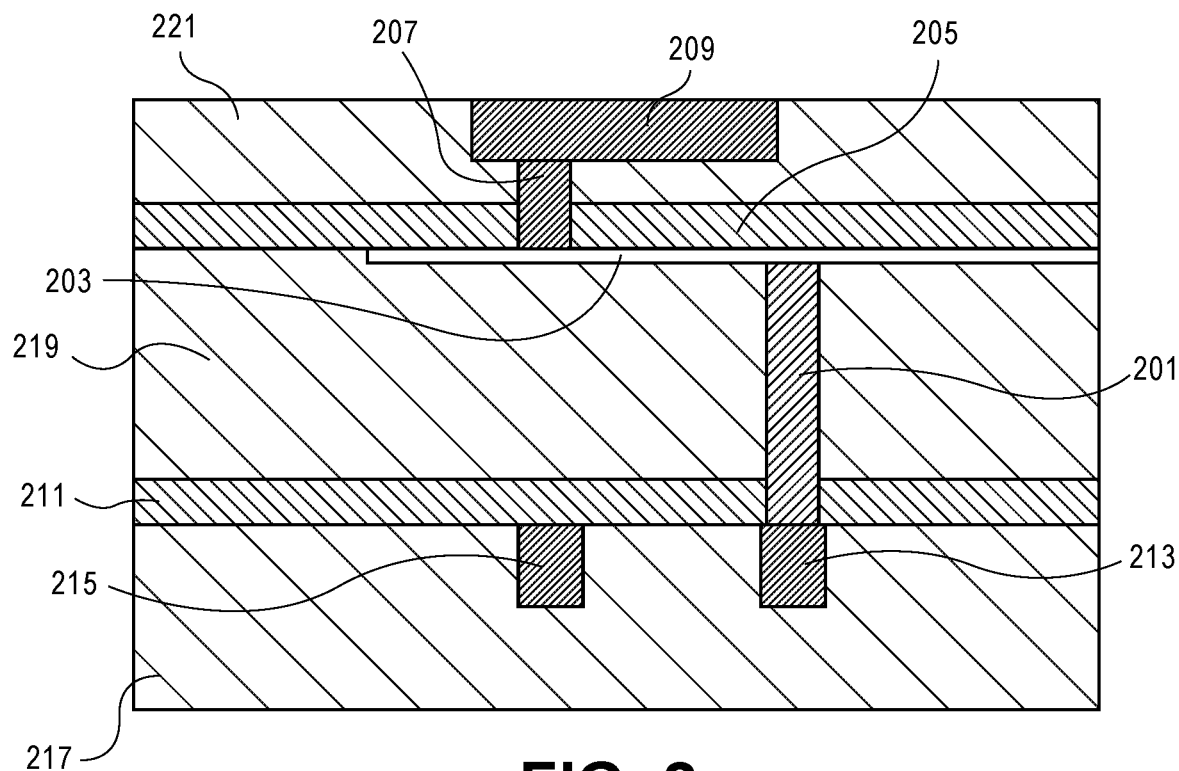
FIG. 2 is an illustration of a cross-section of a through plate interconnect for a vertical MIM according to a conventional approach.

FIG. 2 is an illustration of a cross-section of a through plate interconnect for a vertical MIM according to a conventional approach. FIG. 2 shows MIM capacitor 201, MIM top plate electrode 203, etch stop layer 205, metal interconnect 207, top metal interconnect 209, etch stop layer 211, metal interconnect 213, metal interconnect 215, interlayer dielectric 217, interlayer dielectric 219 and interlayer dielectric 221.

Referring to FIG. 2, the MIM capacitor 201 has a top plate electrode 203 that extends horizontally and contacts interconnect 207 which is coupled to the top metal interconnect 209. The interconnect 207 connects the top metal interconnect 209 to the top plate electrode 203 through etch stop layer 205. The MIM capacitor 201 extends upward through the etch stop layer 211 and the interlayer dielectric 219 and contacts the top plate electrode 203. The MIM capacitor 201 extends downward through the interlayer dielectric 219 and etch stop layer 211 and contacts the top surface of metal interconnect 213.

In the FIG. 2 approach, connections from the MIM capacitor 201 to the top metal interconnect 209 and to the memory cell circuitry that is located below the capacitor can require special routing and landing operations. These operations can involve patterning, and patterning can involve the use of masks.

The use of masks for patterning purposes add expense to the process of fabricating the device. It should be appreciated that each mask that is used requires the successful completion of numerous processing operations and each processing operation involves the completion of numerous other non-trivial actions. Because of this the complexity of a process flow is often measured by the number of masks used.

In the approach of FIG. 2, the connections from the MIM capacitor 201 to the top metal interconnect 209 to the memory cell circuitry that is located below the MIM capacitor 201 require patterning that involves the use of masks. In contrast, in embodiments, a direct connection of the MIM capacitor 201 to the memory cell circuitry that is located below the capacitor can be made (see description below). As such, the approach of embodiments of the disclosure is less complex and costly than the approach that is described with reference to FIG. 2. Embodiments of the disclosure are described herein with reference to FIG. 3 and FIGS. 4A-4D.

Figure 3:
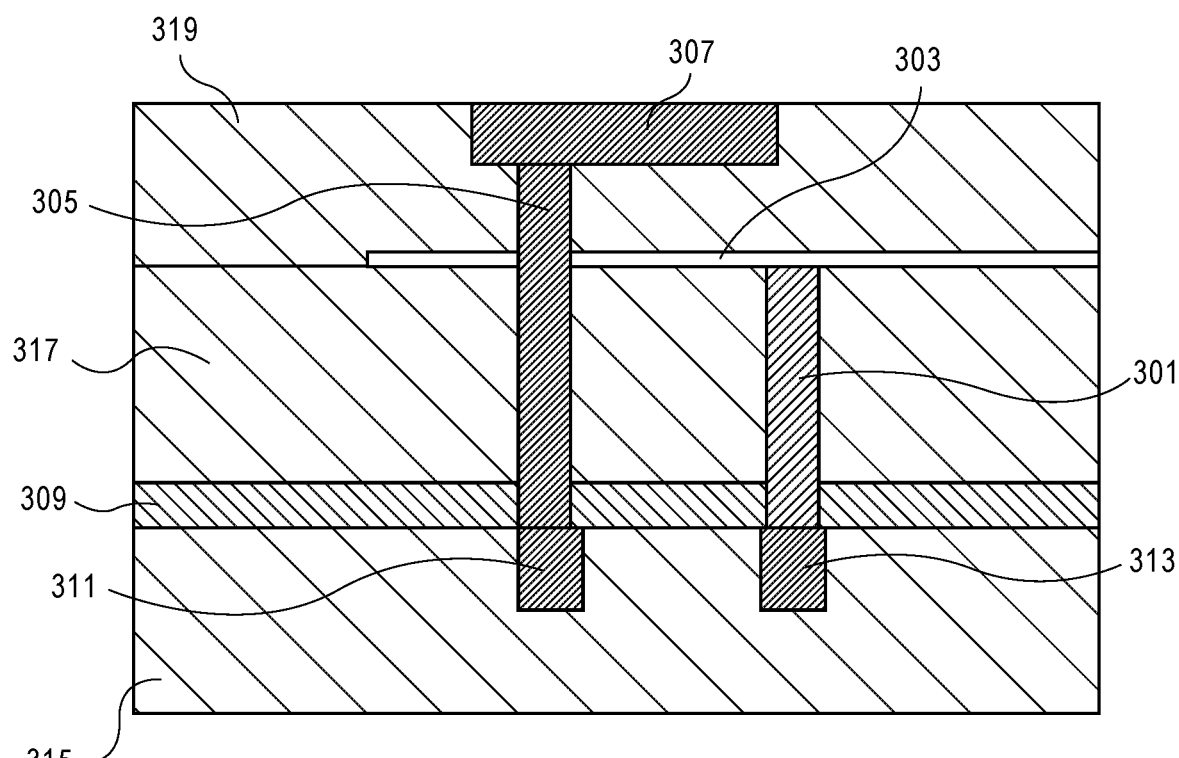
FIG. 3 is an illustration of a cross-section of a through plate interconnect for a vertical MIM according to an embodiment.

FIG. 3 is an illustration of a cross-section of a through plate interconnect for a vertical MIM according to an embodiment of the disclosure. FIG. 3 shows MIM capacitor 301, MIM top plate electrode 303, metal interconnect 305, top metal interconnect 307, etch stop layer 309, bottom interconnect 311, metal interconnect 313, interlayer dielectric 315, interlayer dielectric 317 and interlayer dielectric 319.

Referring to FIG. 3, the MIM top plate electrode 303 extends horizontally from a right edge of the device structure and terminates within the body of the device structure before reaching the left edge of the device structure. The MIM capacitor 301 extends downward from the MIM top plate electrode 303 through the interlayer dielectric 317 and the etch stop layer 309 and contacts the top surface of metal interconnect 313. The via 305 extends downward, in a direction that is parallel to the direction of the MIM capacitor 301, through the MIM top plate electrode 303, the interlayer dielectric 317 and the etch stop layer 309, and contacts the top surface of the bottom interconnect 311. The top metal interconnect 307 contacts the top surface of the via 305.

In an embodiment, for embedded memory applications with capacitors, in contrast to conventional approaches where special routing and landing is required to connect a capacitor plate, e.g., the MIM top plate electrode 303, of the MIM capacitor 301, to memory cell logic, patterning that allows a modular insertion of a capacitor, e.g., the MIM capacitor 301, directly into a design is used. In an embodiment, the connection is made through the via 305 that connects at the level of the embedded MIM capacitor 301 and thus does not require special and/or extra patterning operations.

It should be appreciated that current approaches require extensive routing that uses a great deal of area in order to connect the capacitor to circuitry that is located below the capacitor (e.g., the transistor). For example, such approaches can require a connection with the top plate of the capacitor that is routed around the top of the capacitor in order to make a connection with circuitry that is located below the capacitor. In contrast, as shown in FIG. 3, in an embodiment, the MIM capacitor 301, through the MIM top plate electrode 303, is coupled to parallel the via 305 that can connect directly to circuitry that is located below the MIM capacitor 301.

FIGS. 4A-4D illustrate cross-sections of a microelectronic device structure that correspond to operations performed as a part of the fabrication of a through plate interconnect for a vertical MIM capacitor according to an embodiment. It should be appreciated that FIGS. 4A-4D are only exemplary and other methods and/or processes for forming the microelectronic structure described herein that can result in other cross-sectional views can be used.

Figure 4A:
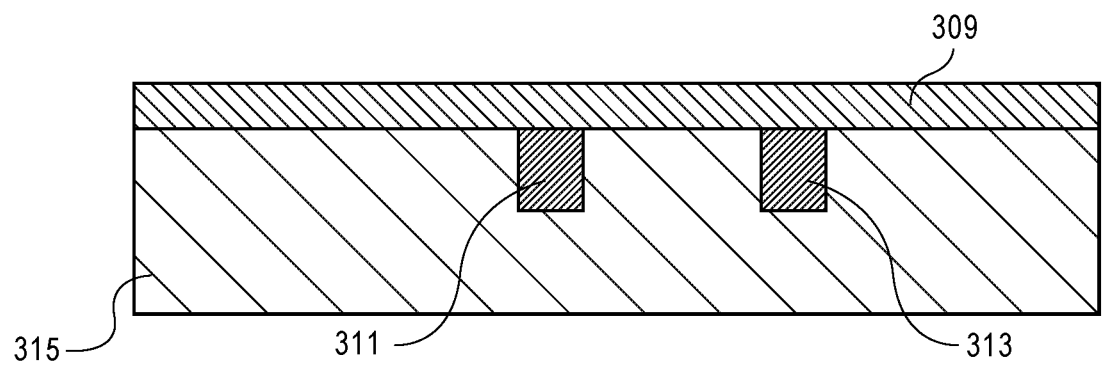
FIGS. 4A-4D illustrate cross-sections of operations performed as a part of the fabrication of a through plate interconnect for a vertical MIM capacitor.

Referring to FIG. 4A, one or more operations are performed that result in the first metal interconnect 311 and the second metal interconnect 313 being formed in the interlayer dielectric 315. In addition, the etch stop layer 309 is formed above the interlayer dielectric 315 and covers the top surfaces of the first metal interconnect 311 and the second metal interconnect 313.

Figure 4B:
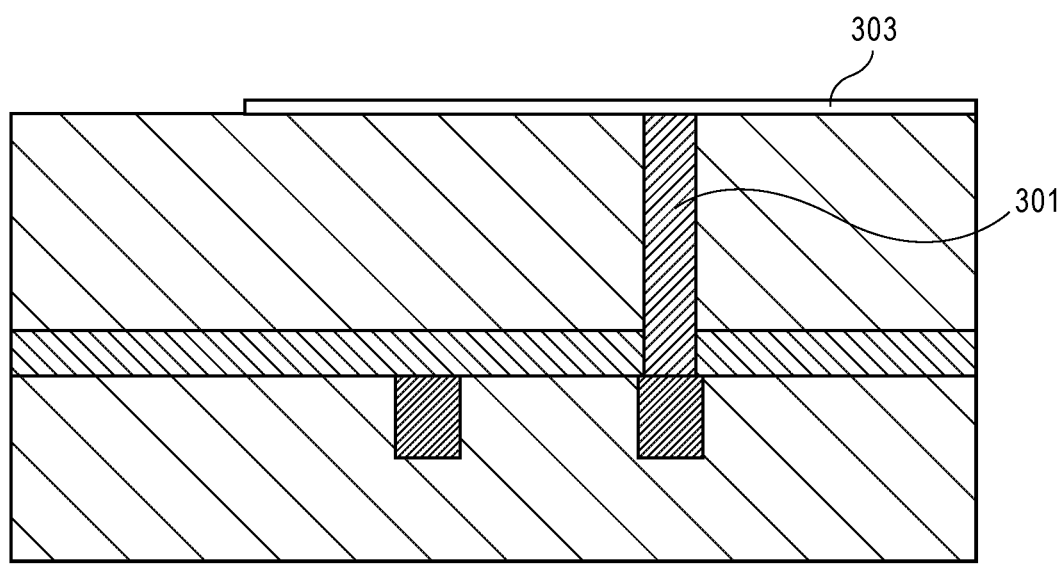

Referring to FIG. 4B, after one or more operations that result in the cross-section shown in FIG. 4A, the interlayer dielectric layer 317 is formed above the etch stop layer 309 and capacitor via is etched and filled and MIM top plate electrode 303 is formed on top of the interlayer dielectric layer 317.

Figure 4C:
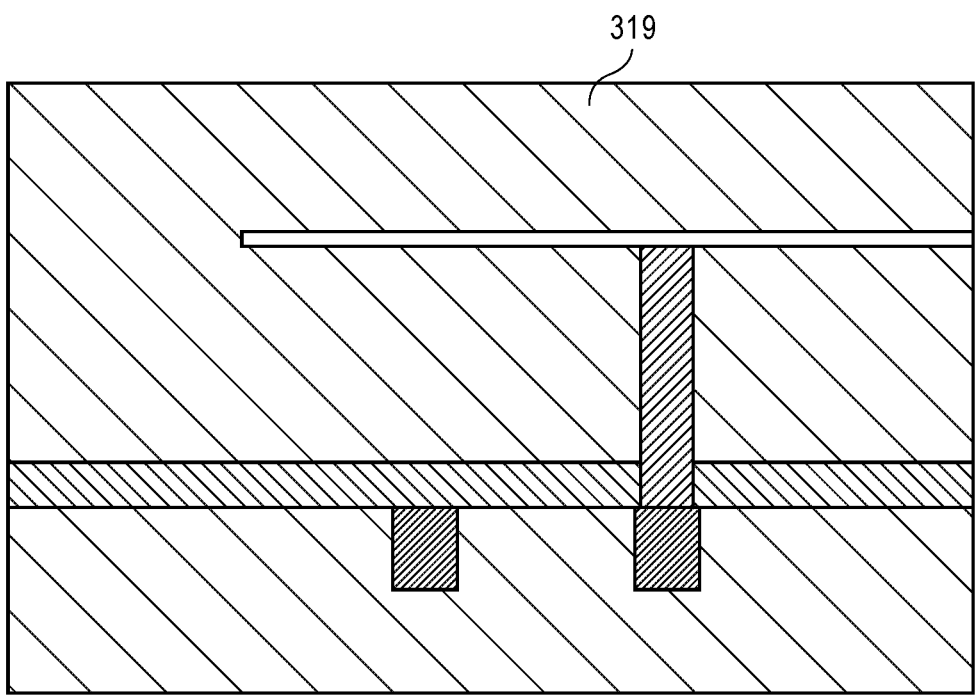

Referring to FIG. 4C, after one or more operations that result in the cross-section shown in FIG. 4B, a top interlayer dielectric layer 319 is deposited. In other embodiments an etch stop layer can be formed before the deposition of the interlayer dielectric layer 319.

Figure 4D:
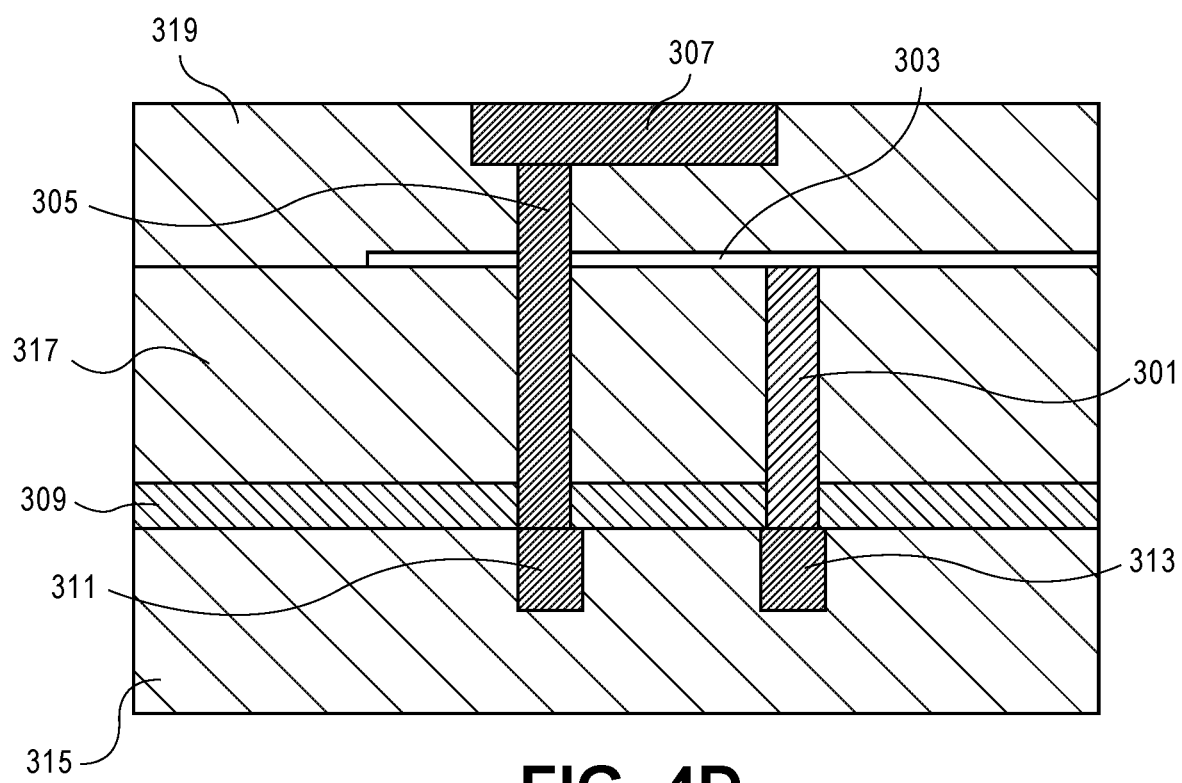

Referring to FIG. 4D, after one or more operations that result in the cross-section shown in FIG. 4C, a via 305 is formed through the top electrode 303 and the etch stop layer 309 lands on the metal interconnect 311. In addition, a top metal interconnect 307 is formed above the via 305.

In an embodiment, the vertical MIM capacitor 301 is connected through the top electrode 303 to the via 305 which can connect to above layers or below layers or can be allowed to hang (e.g., be unconnected). As discussed herein, this connection reduces the area requirement for the circuit. Moreover, the modularity of the MIM capacitor 301 enables efficient pairing with a proximal transistor. Modularity is intended to refer to capacity to add a vertical MIM capacitor such as the vertical MIM capacitor 301 to a layer without disrupting the design or the fabrication process.

It should be appreciated that current approaches require extensive routing that uses a great deal of area in order to connect the capacitor to other circuitry. For example, many approaches require a connection with the top plate of the capacitor that is routed around the top of the capacitor in order to make a connection with circuitry that is located below the capacitor. In contrast, as shown in FIG. 4D, in an embodiment, the MIM capacitor 301, through MIM top plate electrode 303, is coupled to parallel via 305 that can connect directly to circuitry that is located below the MIM capacitor 301.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In addition, the substrate can be formed from glass and/or flexible materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors. In addition, the transistors can be TFTs (thin film transistors) that can be formed from materials that include but are not limited to Si, oxide and compound semiconductors. Moreover, the transistors can include transistors that are formed from material that is formed above the substrate and may not be patterned on or in the substrate.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 5:
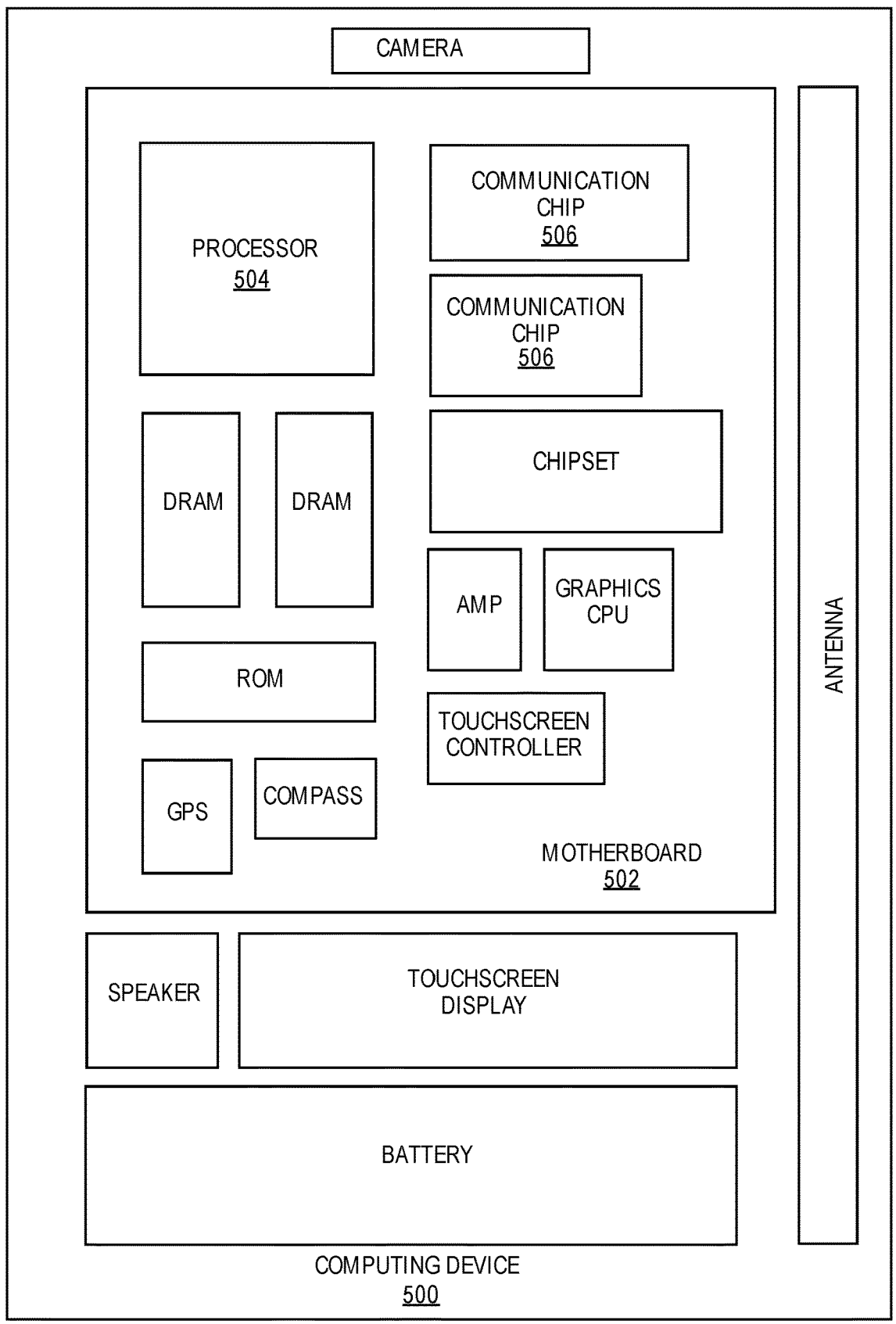
FIG. 5 illustrates a computing device in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 306. For instance, a first communication chip 506 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Figure 6:
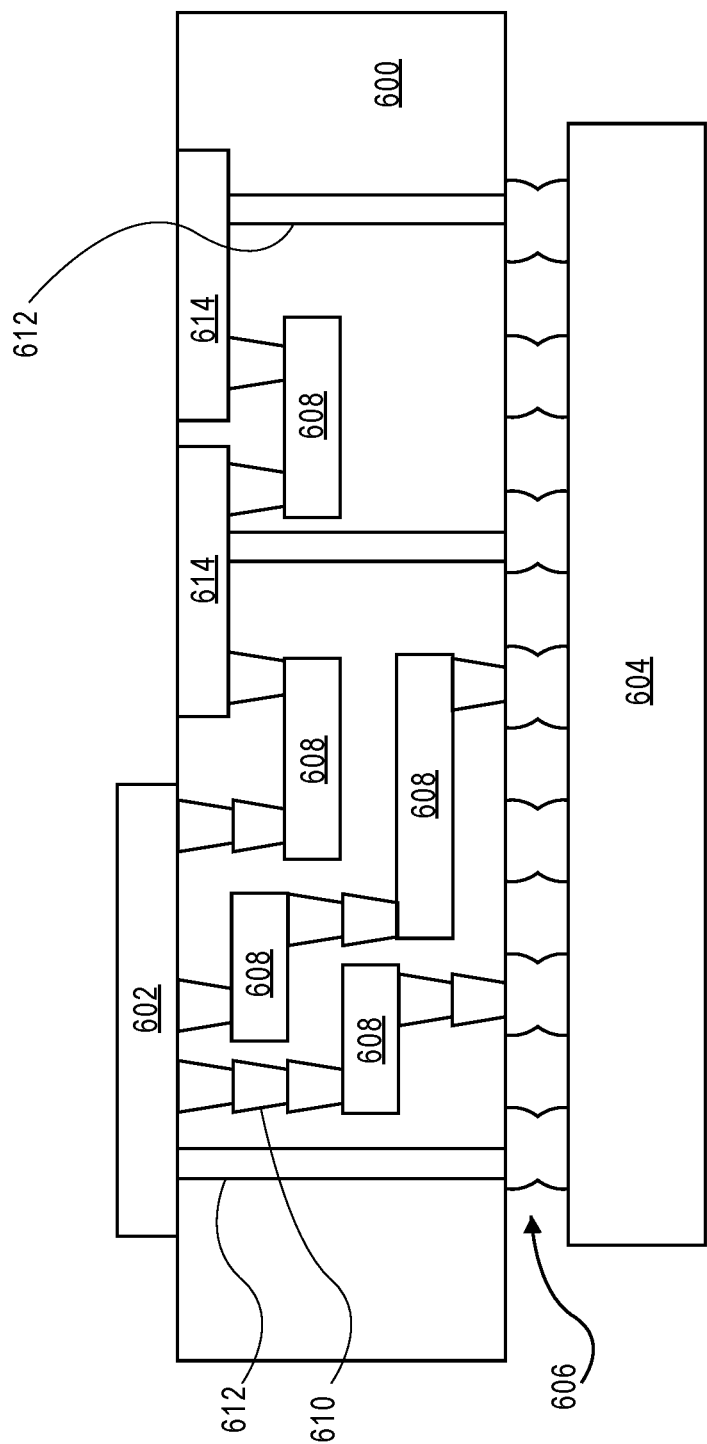
FIG. 6 illustrates an interposer that includes one or more embodiments.

FIG. 6 illustrates an interposer 600 that includes one or more embodiments of the invention. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors (e.g., MIM capacitor 301), decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with embodiments of the invention, apparatuses or processes disclosed herein may be used in the fabrication of interposer 600.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A interconnect structure that includes a first metal interconnect in a bottom dielectric layer, a via that extends through a top dielectric layer, a metal plate, an intermediate dielectric layer, and an etch stop layer, and a metal in the via that extends through the top dielectric layer, the metal plate, the intermediate dielectric layer and the etch stop layer to the top surface of the first metal interconnect. The metal plate is coupled to an MIM capacitor that is parallel to the via. A second metal interconnect is on top of the metal in the via.

Example Embodiment 2

The structure of example embodiment 1, wherein the MIM capacitor is a modular component.

Example Embodiment 3

The structure of example embodiment 1, wherein a space to accommodate the MIM capacitor is in the intermediate dielectric layer.

Example Embodiment 4

The structure of example embodiment 1, wherein the MIM capacitor is formed on top of the etch stop layer and contacts the metal plate.

Example Embodiment 5

The structure of example embodiment 1, wherein the first interconnect is formed underneath the etch stop layer.

Example Embodiment 6

The structure of example embodiment 1, wherein the first interconnect is coupled to memory cell logic.

Example Embodiment 7

The structure of example embodiment 1, 2, 3, 4, 5 or 6, wherein MIM capacitor is part of a capacitor over bitline structure.

Example Embodiment 8

An MIM capacitor interconnect structure that includes an MIM capacitor, a top plate coupled to the MIM capacitor and a via extending parallel to the MIM capacitor through the top plate to contact the top surface of a first interconnect structure in a bottom dielectric layer. A second interconnect structure is coupled to the top surface of the via.

Example Embodiment 9

The structure of embodiment 8, wherein the MIM capacitor is a modular component.

Example Embodiment 10

The structure of example embodiment 8, wherein a space to accommodate the MIM capacitor is in the intermediate dielectric layer.

Example Embodiment 11

The structure of example embodiment 8, wherein the MIM capacitor is formed above a third interconnect structure.

Example Embodiment 12

The structure of example embodiment 8, wherein the first interconnect is formed underneath an etch stop layer.

Example Embodiment 13

The structure of example embodiment 8, wherein the first interconnect is coupled to memory cell logic.

Example Embodiment 14

The structure of example embodiment 8, 9, 10, 11, 12 or 13 wherein the MIM capacitor is part of a capacitor over bitline structure.

Example Embodiment 15

A method includes forming a first metal interconnect in a bottom dielectric layer, forming a via that extends through a top dielectric layer, a metal plate, an intermediate dielectric layer, and an etch stop layer, and forming metal in the via to extend through the top dielectric layer, the metal plate, the intermediate dielectric layer and the etch stop layer to the top surface of the first metal interconnect wherein the metal plate is coupled to an MIM capacitor that is parallel to the via. A second metal interconnect is formed on top of the metal.

Example Embodiment 16

The method of example embodiment 15, wherein the MIM capacitor is a modular component.

Example Embodiment 17

The method of example embodiment 15, wherein the MIM capacitor is inserted into a space that is in the intermediate dielectric layer.

Example Embodiment 18

The method of example embodiment 15, wherein the MIM capacitor extends through the etch stop layer and contacts the top surface of a third metal interconnect.

Example Embodiment 19

The method of example embodiment 15, wherein the first interconnect is formed underneath the etch stop layer.

Example Embodiment 20

The method of example embodiment 15, 16, 17, 18 or 19 wherein the first interconnect is coupled to memory cell logic.

What is claimed is:

1. A interconnect structure, comprising:
   a first metal interconnect in a bottom dielectric layer;
   a via that extends through a top dielectric layer, a metal plate, an intermediate dielectric layer, and an etch stop layer;
   a metal in the via to extend through the top dielectric layer, the metal plate, the intermediate dielectric layer and the etch stop layer to the top surface of the first metal interconnect wherein the metal plate is coupled to an MIM capacitor that is parallel to the via; and
   a second metal interconnect on top of the metal in the via.

2. The structure of claim 1, wherein the MIM capacitor is a modular component.

3. The structure of claim 1, wherein a space to accommodate the MIM capacitor is in the intermediate dielectric layer.

4. The structure of claim 1, wherein the MIM capacitor is formed on top of the etch stop layer and contacts the metal plate.

5. The structure of claim 1, wherein the first interconnect is formed underneath the etch stop layer.

6. The structure of claim 1, wherein the first interconnect is coupled to memory cell logic.

7. The structure of claim 1, wherein MIM capacitor is part of a capacitor over bitline structure.

8. An MIM capacitor interconnect structure, comprising:
   an MIM capacitor;
   a top plate coupled to the MIM capacitor;
   a via extending parallel to the MIM capacitor through the top plate to contact the top surface of a first interconnect structure in a bottom dielectric layer; and
   a second interconnect structure coupled to the top surface of the via.

9. The structure of claim 8, wherein the MIM capacitor is a modular component.

10. The structure of claim 8, wherein a space to accommodate the MIM capacitor is in the intermediate dielectric layer.

11. The structure of claim 8, wherein the MIM capacitor is formed above a third interconnect structure.

12. The structure of claim 8, wherein the first interconnect is formed underneath an etch stop layer.

13. The structure of claim 8, wherein the first interconnect is coupled to memory cell logic.

14. The structure of claim 8, wherein the MIM capacitor is part of a capacitor over bitline structure.

15. A method, comprising:
   forming a first metal interconnect in a bottom dielectric layer;
   forming a via that extends through a top dielectric layer, a metal plate, an intermediate dielectric layer, and an etch stop layer;
   forming metal in the via to extend through the top dielectric layer, the metal plate, the intermediate dielectric layer and the etch stop layer to the top surface of the first metal interconnect wherein the metal plate is coupled to an MIM capacitor that is parallel to the via; and
   forming a second metal interconnect on top of the metal.

16. The method of claim 15, wherein the MIM capacitor is a modular component.

17. The method of claim 15, wherein the MIM capacitor is inserted into a space that is in the intermediate dielectric layer.

18. The method of claim 15, wherein the MIM capacitor extends through the etch stop layer and contacts the top surface of a third metal interconnect.

19. The method of claim 15, wherein the first interconnect is formed underneath the etch stop layer.

20. The method of claim 15, wherein the first interconnect is coupled to memory cell logic.

* * * * *